United States Patent
Fan et al.

(10) Patent No.: US 12,317,476 B2
(45) Date of Patent: May 27, 2025

(54) MEMORY STRUCTURE

(71) Applicant: MACRONIX INTERNATIONAL CO., LTD., Hsinchu (TW)

(72) Inventors: Sheng-Ting Fan, Taipei (TW); Wei-Chen Chen, Taoyuan (TW); Hang-Ting Lue, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 438 days.

(21) Appl. No.: 17/746,996

(22) Filed: May 18, 2022

(65) Prior Publication Data

US 2023/0240062 A1    Jul. 27, 2023

Related U.S. Application Data

(60) Provisional application No. 63/303,508, filed on Jan. 27, 2022.

(51) Int. Cl.
*H10B 12/00* (2023.01)
*H01L 23/528* (2006.01)

(52) U.S. Cl.
CPC ......... *H10B 12/20* (2023.02); *H01L 23/5283* (2013.01)

(58) Field of Classification Search
None
See application file for complete search history.

(56) References Cited

U.S. PATENT DOCUMENTS

| | | | |
|---|---|---|---|
| 7,052,941 B2 | 5/2006 | Lee | |
| 9,053,976 B2 | 6/2015 | Ernst et al. | |
| 9,997,526 B2 | 6/2018 | Sudo et al. | |
| 2016/0300886 A1 | 10/2016 | Oh | |
| 2017/0053906 A1* | 2/2017 | Or-Bach | ............... H10B 12/20 |

(Continued)

FOREIGN PATENT DOCUMENTS

| | | | |
|---|---|---|---|
| JP | 2007525004 A | 8/2007 | |
| JP | 2011527515 A | 10/2011 | |

(Continued)

OTHER PUBLICATIONS

JP Office Action dated Feb. 6, 2024 in Japanese application No. 2022-128896.

(Continued)

*Primary Examiner* — Sarah K Salerno
(74) *Attorney, Agent, or Firm* — McClure, Qualey & Rodack, LLP

(57) ABSTRACT

A memory structure includes a substrate; a first gate structure, a second gate structure and a third gate structure disposed on the substrate, separated from each other along the first direction and respectively extending along the second direction and the third direction; channel bodies separated from each other and passing through the first gate structure, the second gate structure and the third gate structure along the first direction; dielectric films disposed between the first gate structure, the second gate structure, the third gate structure and the channel bodies; and a first side plug electrically connected to the substrate and the channel bodies. The first gate structure, the second gate structure and the third gate structure surround each of the dielectric films and each of the channel bodies, and the dielectric films do not include a charge storage structure.

12 Claims, 11 Drawing Sheets

(56) References Cited

U.S. PATENT DOCUMENTS

| | | |
|---|---|---|
| 2017/0358598 A1 | 12/2017 | Bedeschi |
| 2021/0335798 A1 | 10/2021 | Lee et al. |
| 2021/0358913 A1 | 11/2021 | Kim |

FOREIGN PATENT DOCUMENTS

| | | |
|---|---|---|
| JP | 2012150876 A | 8/2012 |
| JP | 2017130644 A | 7/2017 |
| TW | 202141761 A | 11/2021 |
| TW | I745132 B | 11/2021 |

OTHER PUBLICATIONS

JP Office Action dated Aug. 29, 2023 in Japanese application No. 2022-128896.

\* cited by examiner

MEMORY STRUCTURE

This application claims the benefit of U.S. provisional application Ser. No. 63/303,508, filed Jan. 27, 2022, the subject matter of which is incorporated herein by reference.

BACKGROUND OF THE INVENTION

Field of the Invention

The invention relates in general to a semiconductor structure, and more particularly to a memory structure.

Description of the Related Art

Dynamic random access memories (DRAMs) are currently common semiconductor memories. The structure of traditional DRAM is quite simple, and the data of each bit needs one transistor (1T) and one capacitor (1C) to process, namely 1T1C DRAM. However, in order to meet the market demand, the size of the memory structure needs to be smaller and smaller. Therefore, the structure of the conventional DRAM needs to be further improved.

SUMMARY OF THE INVENTION

The present invention relates to a memory structure. The memory structure of the present application is beneficial to the reduced size of the memory, and can also maintain the performance of the memory structure.

According to an embodiment of the present invention, a memory structure is provided. The memory structure includes a substrate, a first gate structure, a second gate structure and a third gate structure, a plurality of channel bodies, a plurality of dielectric films and a first side plug. The first gate structure, the second gate structure and the third gate structure are disposed on the substrate, are separated from each other along a first direction and respectively extend along a second direction and a third direction, wherein the second gate structure is disposed between the first gate structure and the third gate structure, and the first direction, the second direction and the third direction are intersected with each other. The channel bodies are separated from each other and pass through the first gate structure, the second gate structure and the third gate structure along the first direction. The dielectric films are disposed between the first gate structure and the channel bodies, between the second gate structure and the channel bodies, and between the third gate structure and the channel bodies. The first side plug is electrically connected to the substrate and the channel body. Wherein, the first gate structure, the second gate structure and the third gate structure surround each of the dielectric films and each of the channel bodies, and the dielectric films do not include a charge storage structure.

The above and other aspects of the invention will become better understood with regard to the following detailed description of the preferred but non-limiting embodiment(s). The following description is made with reference to the accompanying drawings.

DETAILED DESCRIPTION OF THE INVENTION

Figure 1:
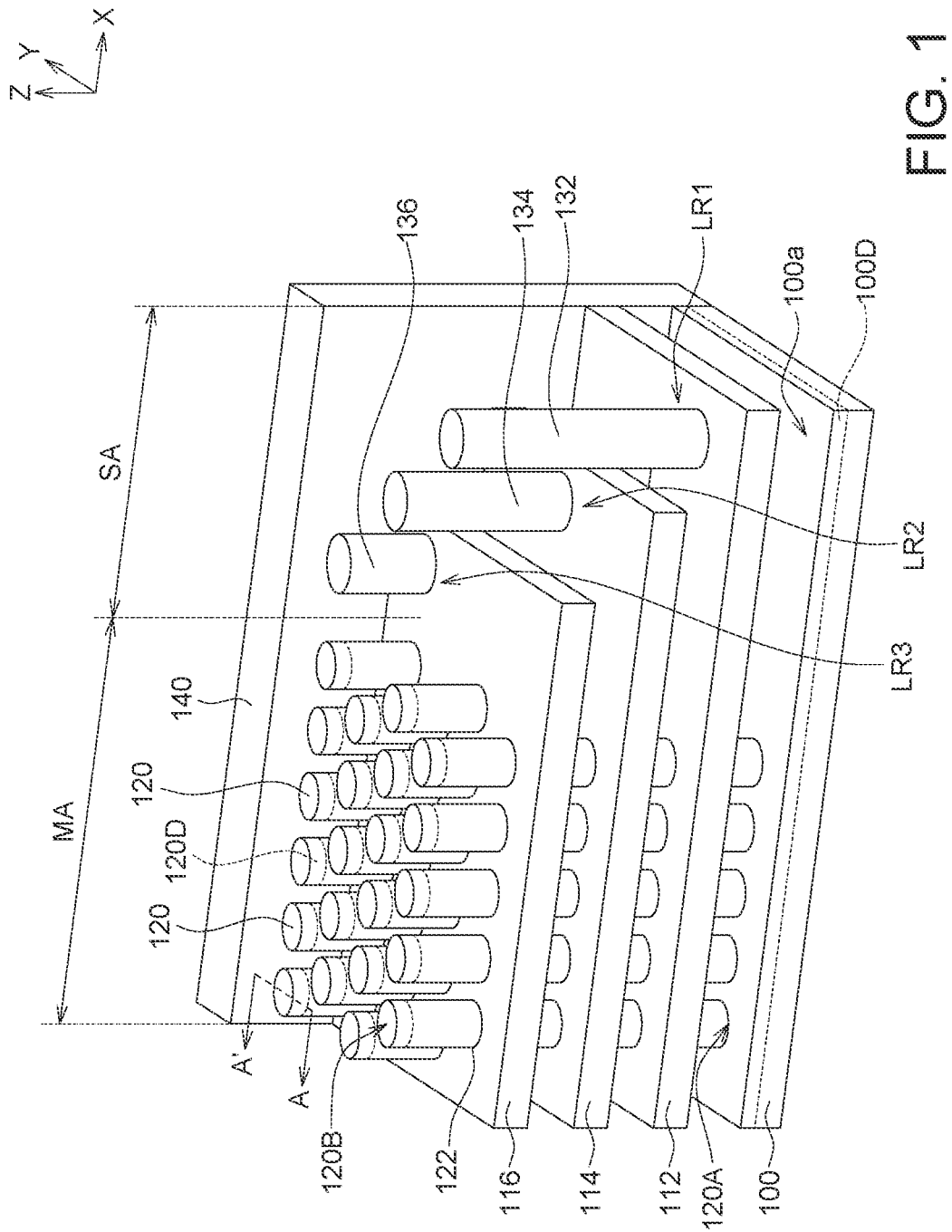
FIG. 1 shows a schematic stereogram of a memory structure according to an embodiment of the present invention.

The following are related embodiments, together with the drawings, to describe the memory structure provided by the present disclosure in detail. However, the present disclosure is not limited thereto. The descriptions in the embodiments, such as the detailed structure, the steps of the manufacturing method, and the material application, etc., are only for the purpose of illustration, and the scope of protection of the present disclosure is not limited to the mentioned implementation aspects.

At the same time, it should be noted that this disclosure does not show all possible embodiments. One of ordinary skilled in the art can make changes and modifications to the structures and manufacturing methods of the embodiments to meet the needs of practical applications without departing from the spirit and scope of the present disclosure. Therefore, other implementation aspects not proposed in the present disclosure may also be applicable. Furthermore, the drawings are simplified for the purpose of clearly explaining the contents of the embodiments, and the dimension and ratios in the drawings are not drawn according to the actual product scale. Therefore, the description and the drawings are only used to describe the embodiments, rather than to limit the protection scope of the present disclosure. The same or similar reference numerals are used to represent the same or similar elements.

In order to ensure the scaling of DRAM, the industry has researched various alternatives to capacitor-less DRAM. Single-transistor DRAM (1T DRAM) failed to become a successful commercial product due to uncontrollable channel potential. When the word line (WL) bias is switched to other operations during reading, programming or erasing, the large WL capacitance of 1T DRAM easily couples the gate bias to the floating body and causes a tiny memory window. Two-transistor DRAM (2T DRAM) also suffers from a similar problem that stored data is easily disturbed by word line bias during transient operation. In addition, 2T DRAM requires the use of very expensive monolithic integration to realize three-dimensional DRAM (3D DRAM).

In order to overcome the above problems, the present invention provides a three-dimensional memory structure including 3 transistors (3T) (as shown in memory structures 10 and 20 in FIGS. 1 and 2), for 3D DRAM characteristics and thyristor operation.

FIG. 1 is a three-dimensional schematic diagram of a memory structure 10 according to an embodiment of the present invention. In the present embodiment, Z direction represents a first direction, Y direction represents a second direction, and X direction represents a third direction, as shown in FIG. 1.

Referring to FIG. 1, a memory structure 10 includes a substrate 100, a first gate structure 112, a second gate structure 114, a third gate structure 116, a plurality of channel bodies 120, a plurality of dielectric films 122, a first plug 132, a second plug 134, a third plug 136 and a first side plug 140. The substrate 100 has an upper surface 100a, the upper surface 100a is parallel to the second direction (e.g., Y direction) and the third direction (e.g., X direction), and a normal direction of the upper surface 100a is parallel to the first direction (e.g., Z direction). A dopant may be doped in a region 100D of the substrate 100 adjacent to the upper surface 100a. In one embodiment, the region 100D of the substrate 100 adjacent to the upper surface 100a has a first conductivity type, for example, a high concentration of an N-type doping (N+). The region 100D in the substrate 100 may serve as a common source line.

The first gate structure 112, the second gate structure 114 and the third gate structure 116 are disposed on the substrate 100, are sequentially stacked along the first direction (e.g., Z direction) and are separated from each other, and are respectively extend along the second direction (e.g., Y direction) and the third direction (e.g., X direction), wherein the second gate structure 114 is disposed between the first gate structure 112 and the third gate structure 116, the first direction, the second direction and the third direction are intersected with each other, for example, perpendicular to each other, that is, the Z direction, the Y direction and the X direction may be perpendicular to each other. In order to make the drawing more concise, some insulating materials are omitted in FIG. 1, for example, the insulating materials between the substrate 100, the first gate structure 112, the second gate structure 114 and the third gate structure 116 are omitted. In some embodiments, the first gate structure 112, the second gate structure 114 and the third gate structure 116 may serve as a word line, respectively.

The channel bodies 120 are separated from each other along the second direction (e.g., Y direction) and the third direction (e.g., X direction) and pass through the first gate structure 112, the second gate structure 114 and the third gate structure 116 along the first direction (e.g., Z direction), and extend to the substrate 100, for example, the channel bodies 120 are in electrical contact with the substrate 100 to form vertical channel structures. The channel bodies 120 are, for example, floating bodies. A transistor is formed at each of intersections between the channel bodies 120 and each of gate structures (i.e., the first gate structure 112, the second gate structure 114 and the third gate structure 116).

Each of the channel bodies 120 has a first end 120A electrically contacting the upper surface 100a of the substrate 100 and a second end 120B away from the upper surface 100a, and the second end 120B is opposite to the first end 120A. A dopant may be doped in the regions 120D of the channel bodies 120 adjacent to the second ends 120B.

In an embodiment, such as an embodiment in which Band-to-Band Tunneling (BTBT) is used as the operating mechanism, the regions 120D of the channel bodies 120 adjacent to the second ends 120B have a first conductivity type, for example, a high concentration of N-type doping (N+). In another embodiment, such as an embodiment in which a thyristor is used as the operating mechanism, the regions 120D of the channel bodies 120 adjacent to the second ends 120B have a second conductivity type, such as a high concentration of P type doping (P+).

In one embodiment, the regions 100D can be served as a source, and the regions 120D can be served as drains, but the invention is not limited thereto.

The dielectric films 122 are disposed between the first gate structure 112 and the channel bodies 120, between the second gate structure 114 and the channel bodies 120, and between the third gate structure 116 and the channel bodies 120. That is, the dielectric films 122 extend along the first direction (e.g., Z direction) and surround side surfaces of the channel bodies 120 to separate the first gate structure 112 from the channel bodies 120, separate the second gate structure 114 from the channel bodies 120, and separate the third gate structure 116 from the channel bodies 120. In one embodiment, the dielectric films 122 surrounding different channel bodies 120 are connected to each other, extend along the second direction (e.g., Y direction) and the third direction (e.g., X direction), covering the first gate structure 112, the second gate structure 114 and the third gate structure 116, for example, covering the upper and lower surfaces of the first gate structure 112, the second gate structure 114 and the third gate structure 116 (not shown).

The first gate structure 112, the second gate structure 114 and the third gate structure 116 surround each of the dielectric films 122 and each of the channel bodies 120, and also extend to the space between adjacent channel bodies 120 along the second direction (e.g., Y direction) and the third direction (e.g., X direction). Since the first gate structure 112, the second gate structure 114 and the third gate structure 116 surround the corresponding positions (i.e. the intersection positions between the first gate structure 112, the second gate structure 114 and the third gate structure 116) of the entire side surface of the channel bodies 120, and it is also called a gate-all-around (GAA) structure. Moreover, each of channel bodies 120 can be controlled by three gates (i.e., the first gate structure 112, the second gate structure 114 and the third gate structure 116).

The first side plug 140 extends along the first direction (e.g., Z direction) and the third direction (e.g., X direction), and is in electrical contact with the substrate 100. For example, the first side plug 140 is electrically connected to the substrate 100 and the channel bodies 120.

The substrate 100 corresponds to a memory array area MA and a staircase area SA. The channel bodies 120 are disposed in the memory array area MA. The staircase area SA is adjacent to the memory array area MA. The first gate structure 112, the second gate structure 114 and the third gate structure 116 form a stepped structure in the staircase area SA, and expose a first landing region LR1, a second landing region LR2 and a third landing region LR3, respectively. A first plug 132, a second plug 134, and a third plug 136 are respectively disposed on the first landing region LR1, the second landing region LR2 and the third landing region LR3, and respectively extend along the first direction (e.g., Z direction) to electrically contact the first gate structure 112, the second gate structure 114 and the third gate structure 116.

In some embodiments, the substrate 100 may include a semiconductor substrate, such as a bulk silicon substrate. In the present embodiment, the channel bodies 120 may be formed by an epitaxial growth process, and the material of the channel bodies 120 may include monocrystalline silicon. During operation (e.g., programming or erasing) of the memory device 10, the channel bodies 120 may be used to store carriers (e.g., electrons or holes). The dielectric films 122 do not need to have the function of storing carriers (e.g., electrons or holes), so the dielectric films 122 do not include a charge storage structure, such as an oxide-nitride-oxide (ONO) structure. In other words, there is no ONO structure in the space between the channel bodies 120 and the gate structures (i.e., the first gate structure 112, the second gate structure 114 and the third gate structure 116). In one embodiment, the material of the dielectric films 122 include a dielectric material, such as oxide, and the dielectric films 122 may be a single-layer structure. In one embodiment, the material of the dielectric film 122 may include a high dielectric constant material (high-k material). In one embodiment, the material of the first plug 132, the second plug 134, the third plug 136, the first side plug 140, the first gate structure 112, the second gate structure 114, and the third gate structure 116 may comprise a semiconductor material or a metallic material. For example, the first gate structure 112, the second gate structure 114 and the third gate structure 116 may comprise monocrystalline silicon or polysilicon or metal. It should be understood that the materials of the above-mentioned elements of the present invention are not limited thereto.

Figure 2:
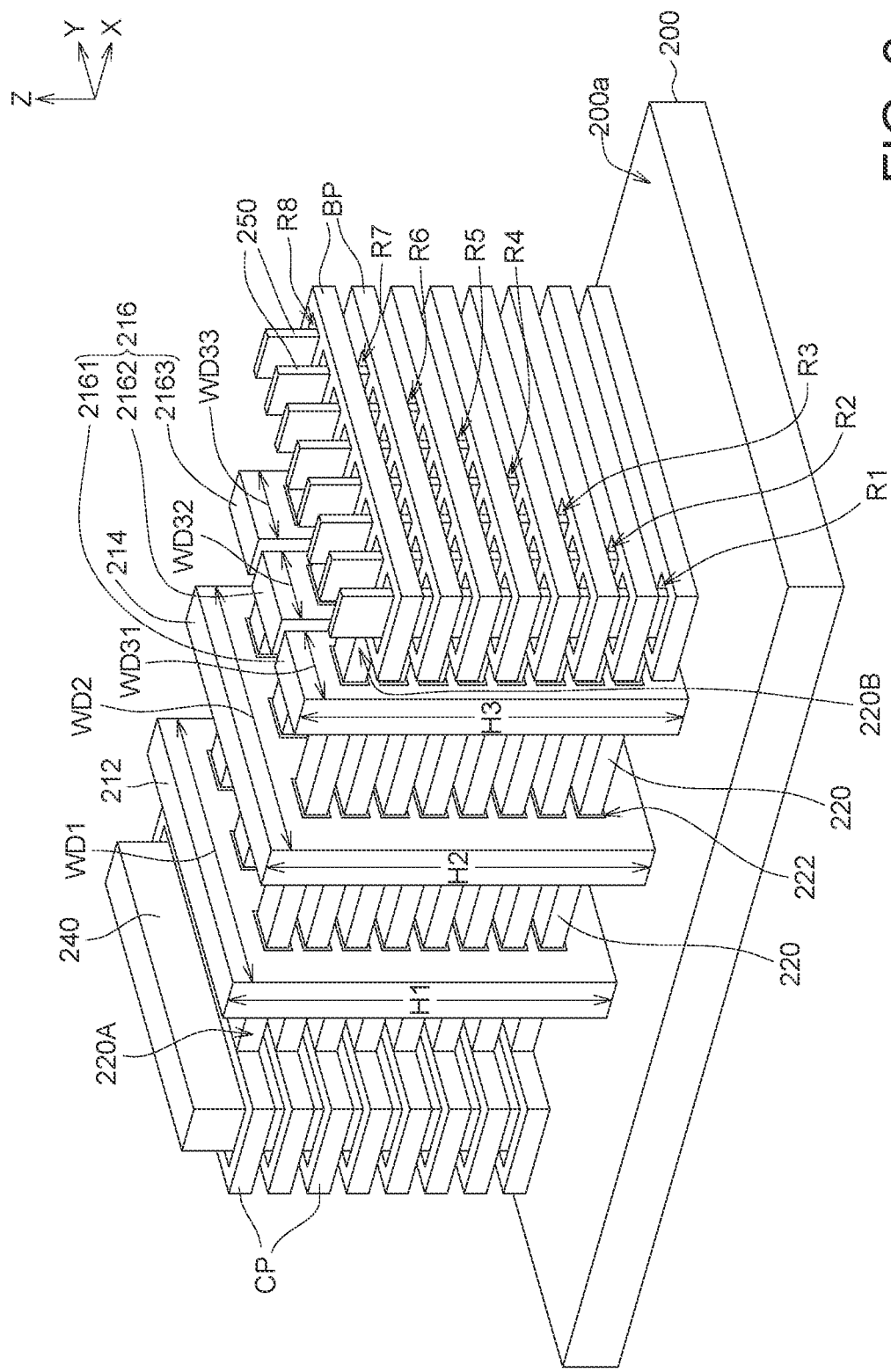
FIG. 2 shows a schematic stereogram of a memory structure according to another embodiment of the present invention.

FIG. 2 is a schematic stereogram of a memory structure 20 according to another embodiment of the present invention. In the present embodiment, Z direction represents a third direction, Y direction represents a second direction, and X direction represents a first direction, as shown in FIG. 2.

Referring to FIG. 2, the memory structure 20 includes a substrate 200, a first gate structure 212, a second gate structure 214, a third gate structure 216, a plurality of channel bodies 220, a plurality of dielectric films 222, a first plug 232, a second plug 234, a third plug 236, a first side plug 240, a second side plug 250, a plurality of first side pads CP and a plurality of second side pads BP. The substrate 200 has an upper surface 200a, the upper surface 200a is parallel to the first direction (e.g. X direction) and the second direction (e.g. Y direction), and the normal direction of the upper surface 200a is parallel to the third direction (e.g. Z direction).

The first gate structure 212, the second gate structure 214, and the third gate structure 216 are disposed on the substrate 200 along a first direction (e.g., X direction), and are separated from each other along the first direction (e.g., X direction), and extend along the second direction (e.g., Y direction) and the third direction (e.g., Z direction), wherein the second gate structure 214 is disposed between the first gate structure 212 and the third gate structure 216. The first direction, the second direction and the third direction are intersected with each other, for example, perpendicular to each other, that is, the Z direction, the Y direction and the X direction may be perpendicular to each other. The third gate structure 216 includes a first island structure 2161, a second island structure 2162 and a third island structure 2163, the first island structure 2161, the second island structure 2162 and the third island structure 2163 respectively extend along the third direction (e.g., Z direction), and are spaced apart from each other along a second direction (e.g., Y direction). In one embodiment, a height H3 of the first island structure 2161, the second island structure 2162, or the third island structure 2163 in the third direction (e.g., Z direction) is equal to a height H1 or H2 of the first gate structure 212 or the second gate structure 214 in the third direction (e.g., Z direction); a width WD31, WD32 or WD33 of the first island structure 2161, the second island structure 2162, or the third island structure 2163 in the second direction (e.g., Y direction) is smaller than a width WD1 or WD2 of the first gate structure 2161 or the second gate structure 2162 in the second direction (e.g., Y direction), but the present invention is not limited thereto. In order to make the drawing more concise, some insulating materials are omitted in FIG. 2, for example, the insulating materials between the substrate 200, the first gate structure 212, the second gate structure 214 and the third gate structure 216, and the insulating material between the first island structure 2161, the second island structure 2162 and the third island structure 2163 is omitted. In some embodiments, the first gate structure 212, the second gate structure 214 and the third gate structure 216 may each serve as a word line.

The channel bodies 220 are separated from each other along the second direction (e.g., Y direction) and the third direction (e.g., Z direction) and pass through the first gate structure 212, the second gate structure 214 and the third gate structure 216 along the first direction (e.g., X direction), that is, the extending direction of the channel bodies 220 is parallel to the upper surface 200a of the substrate 200, to form a horizontal channel structure. The channel bodies 220 are, for example, floating bodies. Each of the channel bodies 220 has a first end 220A and a second end 220B, the first end 220A is adjacent to the first gate structure 212 and away from the third gate structure 216, and the second end 220B is adjacent to the third gate structure 216 and away from the first gate structure 212, and the second end 220B is opposite to the first end 220A.

The first side pads CP are stacked along the third direction (e.g., Z direction) and separated from each other along the third direction (e.g., Z direction), and each of the first side pads CP is connected to the corresponding first end 220A in the channel bodies 220. The second side pads BP are stacked along the third direction (e.g., Z direction) and separated from each other along the third direction (e.g., Z direction), and each of the second side pads BP is connected to the corresponding second end 220B in the channel bodies 220. A dopant can be doped in the first side pads CP and the second side pads BP.

In an embodiment, such as an embodiment in which Band-to-Band Tunneling (BTBT) is used as the operating mechanism, the first side pads CP have a first conductivity type, for example, having a high concentration of N-type doping (N+); the second side pads BP have a first conductivity type, for example, having a high concentration of N-type doping (N+). In another embodiment, such as an embodiment in which a thyristor is used as the operating mechanism, the first side pads CP have a first conductivity type, for example, having a high concentration of N-type doping (N+); the second side pads BP have a second conductivity type, for example, having a high concentration of P-type doping (P+).

In one embodiment, the first side pad CP can be used as a source, and the second side pad BP can be used as a drain, but the invention is not limited thereto.

The dielectric films 222 are disposed between the first gate structure 212 and the channel bodies 220, between the second gate structure 214 and the channel bodies 220, and between the third gate structure 216 and the channel bodies 220. That is, the dielectric films 222 extend along the first direction (e.g., X direction) and surround the side surfaces of the channel bodies 220 to separate the first gate structure 212 from the channel bodies 220, separate the second gate structure 214 from the channel bodies 220, and also separate the third gate structure 216 from the channel bodies 220. In one embodiment, the dielectric films 222 surrounding different channel bodies 220 are connected to each other, extend along the second direction (e.g., Y direction) and the third direction (e.g., Z direction), covering the first gate structure 212, the second gate structure 214 and the third gate structure 216 (not shown).

The first gate structure 212, the second gate structure 214 and the third gate structure 216 surround each of the dielectric films 222 and each of the channel bodies 220, and also extend into the space between adjacent channel bodies 220 along the second direction (e.g., Y direction) and the third direction (e.g., Z direction). Since the first gate structure 212, the second gate structure 214 and the third gate structure 216 surround the side surfaces of the corresponding positions (i.e. the intersection positions between the first gate structure 212, the second gate structure 214, the third gate structure 216 and the channel bodies 220) of the channel bodies 220, it is also called a gate-all-around (GAA) structure. Moreover, each of channel bodies 220 can be controlled by three gates (i.e., the first gate structure 212, the second gate structure 214 and the third gate structure 216). Specifically, the channel bodies 220 corresponding to the first island structure 2161 can be controlled by the first gate structure 212, the second gate structure 214 and the first island structure 2161, the channel bodies 220 corresponding to the second island structure 2162 can be controlled by the first gate structure 212, the second gate structure 214 and the second island structure 2162, and the channel bodies 220 corresponding to the third island structure 2163 can be controlled by the first gate structure 212, the second gate structure 214 and the third island structure 2163. A transistor is formed at each of the intersection positions between the channel bodies 220 and each of the gate structures (i.e., the first gate structure 212, the second gate structure 214 and the first island structure 2161, the second island structure 2162 and the third island 2163 in the third gate structure 216).

The first side plug 240 extend along the second direction (e.g., Y direction) and the third direction (e.g., Z direction), and are in electrical contact with the substrate 200 and the first side pads CP. For example, the first side plug 240 is electrically connected to the substrate 200 and the channel bodies 220.

The second side plugs 250 are separated from each other along the second direction (e.g., Y direction), and respectively extend along the third direction (e.g., Z direction) to electrically contact a plurality of landing regions R1 to R8 on the second side pads BP. In the present embodiment, heights of the second side plugs BP in the third direction (e.g., Z direction) gradually increases along the second direction (e.g., Y direction), and the landing regions R1 to R8 form a stepped structure. However, the present invention is not limited thereto. The top portions of the second side plugs 250 can be respectively connected to a bit line (not shown). Different second side plugs 250 are connected to different bit lines (not shown). That is, the channel bodies 220 in the same layer can be electrically connected to the same second side plug 250 and the corresponding bit line (not shown). The number of the second side plugs 250 can be respectively the same as the number of the first side pads CP, the number of the channel bodies 220 and the number of the second side pads BP along the third direction (e.g., Y direction), such as 8, but the present invention is not limited thereto. For example, in other embodiments, the number of the second side plugs 250, the number of the first side pads CP along the third direction (e.g., Y direction), the number of the channel bodies 220 along the third direction (e.g., Y direction) and the number of the second side pads BP along the third direction (e.g., Y direction) may be greater than 8.

In some embodiments, the substrate 200 may include a semiconductor substrate, such as a bulk silicon substrate. In the present embodiment, the channel bodies 220 may be formed by an epitaxial growth process, and the material of the channel bodies 220 may include monocrystalline silicon. During operation (e.g., programming or erasing) of the memory device 20, the channel bodies 220 may be used to store carriers (e.g., electrons or holes). The dielectric films 222 do not need to have the function of storing carriers (e.g., electrons or holes), so the dielectric films 222 do not include a charge storage structure, such as an oxide-nitride-oxide (ONO) structure. In other words, there is no ONO structure in the space between the channel bodies 220 and the gate structures (i.e., the first gate structure 212, the second gate structure 214 and the third gate structure 216). In one embodiment, the material of the dielectric films 222 includes a dielectric material, such as oxide, and the dielectric film 222 may be a single-layer structure. In one embodiment, the material of the dielectric film 222 may include a high dielectric constant material (high-k material). In one embodiment, the material of the first side plug 240, the second side plugs 250, the first side pads CP, the second side pads BP, the first gate structure 212, the second gate structure 214, and the third gate structure 216 may include semiconductor material or metal material. For example, the first side pads CP, the second side pads BP, the first gate structure 212, the second gate structure 214 and the third gate structure 216 may include monocrystalline silicon or polycrystalline silicon or metal. It should be understood that the materials of the above-mentioned elements of the present invention are not limited thereto.

According to some embodiments, the memory structure 20 may be formed by a stacked gate-all-around nanosheet CMOS process. Compared with the memory structure 10 with vertical channels, the memory structure 20 with horizontal channels can have more layers of channel bodies 220 being stacked, so more bits can be formed, and the memory structure 20 with horizontal channels can have higher density of memory cells, and it is more beneficial to the miniaturization of the size of the memory structure.

Figure 3A:
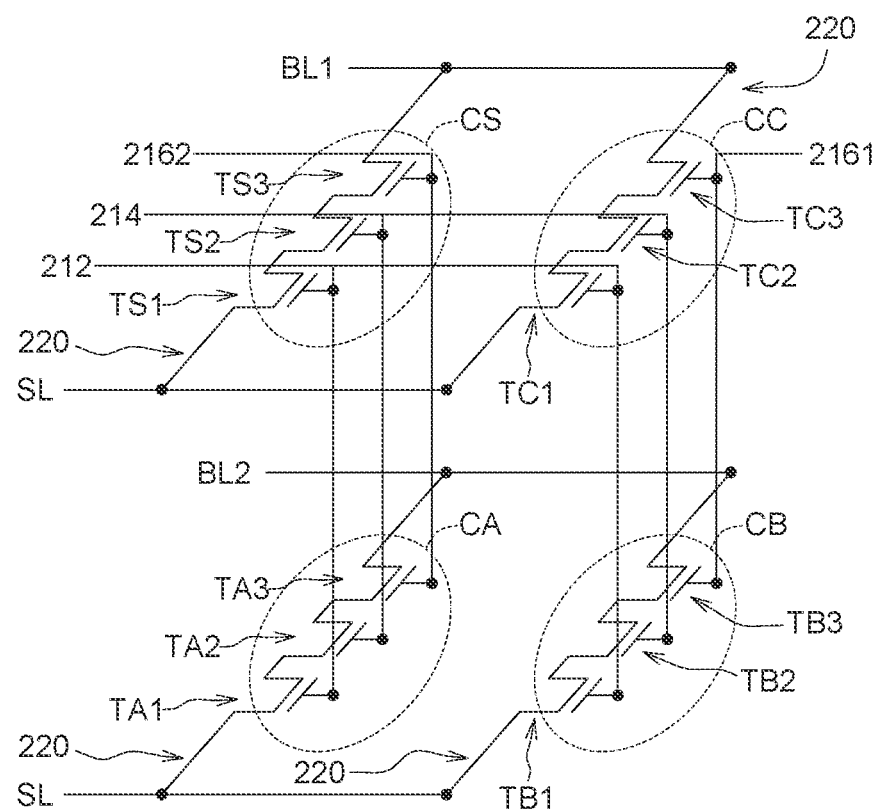
FIG. 3A shows an equivalent circuit diagram of a memory structure according to another embodiment of the present invention.
Figure 3B:
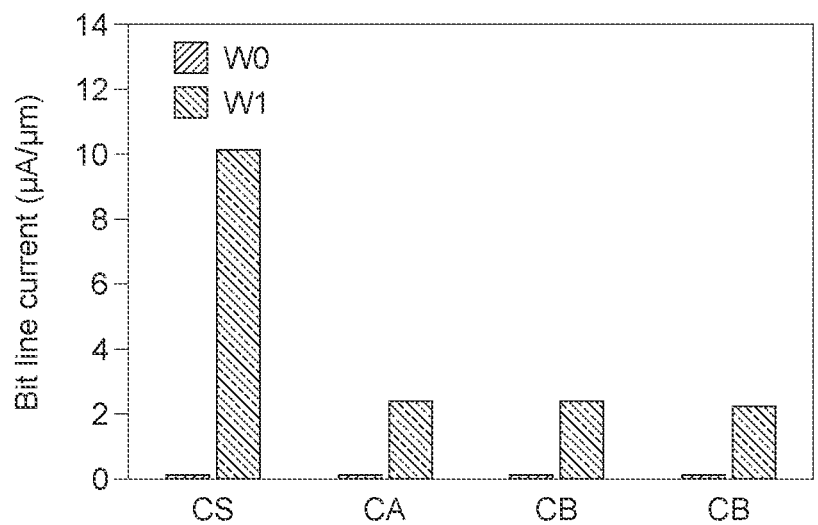
FIGS. 3B and 3C illustrate simulation results of programming and erasing operations of a memory structure according to another embodiment of the present invention.
Figure 3C:
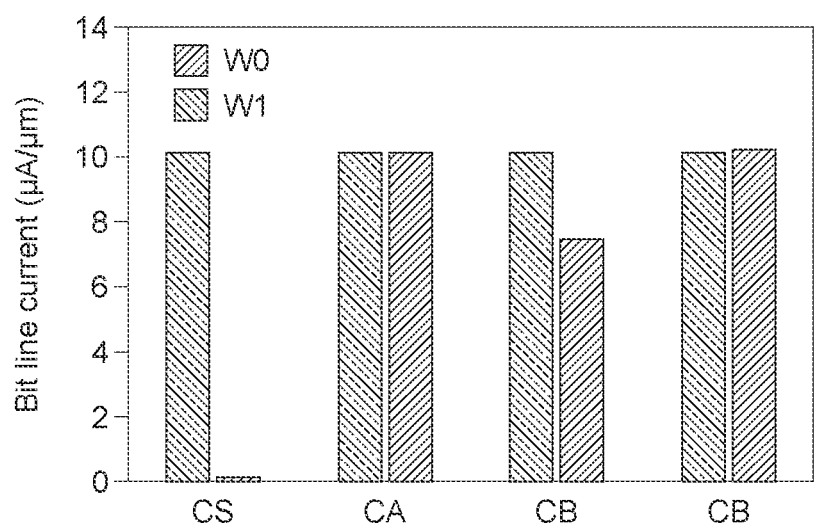

FIG. 3A shows an equivalent circuit diagram of the memory structure 20 according to another embodiment of the present invention. FIGS. 3B and 3C illustrate simulation results of programming and erasing operations of the memory structure 20 according to another embodiment of the present invention.

Referring to FIGS. 2 and 3A at the same time, FIG. 3A exemplarily shows four adjacent channel bodies 220 in FIG. 2, for example, a transistor is formed at each of intersection positions between the channel bodies 220, the first gate structure 212, the second gate structure 214 and the first island structure 2161 and the second island structure 2162 in the third gate structure 216. As shown in FIG. 3A, the transistors TA1, TA2 and TA3 connected by the same channel body 220 together form a memory cell unit CA; the transistors TB1, TB2 and TB3 connected by the same channel body 220 together form a memory cell unit CB; the transistors TC1, TC2 and TC3 connected by the same channel body 220 together form a memory cell unit CC; the transistors TS1, TS2 and TS3 connected by the same channel body 220 together form a memory cell Unit CS. The first ends 220A of the channel bodies 220 are connected to the corresponding first side pads CP. The first side pads CP of different layers are electrically connected to a first side plug 240 and are electrically connected to a source line SL. Therefore, the memory cells CA, CB, CC and CS are connected to the same source line SL (i.e., equipotential). The second ends 220B of the channel bodies 220 are connected to the corresponding second side pads BP, different layers of the second side pads BP electrically contact different second side plugs 250, and the different second side plugs 250 are respectively electrically connected to different bit lines, for example, the memory cells CC and CS in the same layer are electrically connected to the first bit line BL1, and the memory cells CA and CB in the same layer are electrically connected to the second bit line BL2. The memory cells CA, CB, CC and CS share the first gate structure 212 and the second gate structure 214, respectively. The memory cells CA and CS share the first island structure 2161 in the third gate structure 216. The memory cells CB and CC share the second island structure 2162 in the third gate structure 216.

The operation performance of the memory structure 20 shown in FIGS. 2 and 3A can be observed by computer simulation using a Technology Computer Aided Design (TCAD) tool, wherein the memory cell unit CS is the selected memory cell unit, and other memory cell units CA, CB, and CC are unselected memory cell units (e.g., inhibited memory cell units), and the results are shown in FIGS. 3B and 3C. During the simulation, different bias voltages listed in Table 1 below can be applied to the first gate structure 212, the second gate structure 214, the first island structure 2161, the second island structure 2162, the first bit line BL1, the second bit line BL2 and the source line SL to perform different operation modes, such as programming or erasing operation modes. In the present embodiment and the drawings, "W1" is the abbreviation of "write 1", which indicates the operation mode of programming the memory cells of the memory structure 20 to the data state of "1" (i.e., logic "1"), which is also called as the programming operation mode; "W0" is the abbreviation of "write 0", which indicates the operation mode of programming the memory cells of the memory structure 20 to the data state of "0" (i.e., logic "0"), which is also called as the operating mode of erasing.

TABLE 1

| | first gate structure 212 (V) | second gate structure 214 (V) | first island structure 2161 (V) | second island structure 2162 (V) | first bit line BL1 (V) | second bit line BL2 (V) | source line SL (V) |
|---|---|---|---|---|---|---|---|
| W 1 | 4 | 4 | 2 | 0 | 5 | 0 | 0 |
| W 0 | 4 | 4 | −6 | 4 | −5 | 0 | 0 |

As shown in FIG. 3B, when the operation sequence is from "W0" mode to "W1" mode, the selected memory cell unit CS has a higher bit line current in "W1" mode, e.g., about 10 μA/μm, unselected memory cell units CA, CB, and CC have lower bit line currents in "W1" mode, e.g., about 2 μA/μm. It can be seen that, according to the operation method of an embodiment of the present invention, there can be a window of about 8 μA/μm after the "W1" mode, and the selected memory cell unit CS can be distinguished from the unselected memory cells CA, CB and CC, and the memory cell units CA, CB and CC are successfully inhibited.

As shown in FIG. 3C, when the operation sequence is from "W1" mode to "W0" mode, the selected memory cell unit CS has a lower bit line current in the "W0" mode, e.g., about 0 μA/μm, the unselected memory cell units CA, CB and CC have higher bit line current in W0" mode, e.g. about 7 to 10 μA/μm. It can be seen that, according to the operation method of an embodiment of the present invention, there can be a window of at least about 7 μA/μm after the "W0" mode, and the selected memory cell unit CS can be distinguished from the unselected memory cell units CA, CB and CC, and memory cell units CA, CB and CC are successfully inhibited.

FIGS. 4A-4D illustrate simulation results of different operations of the memory structure 10 according to an embodiment of the present invention, such as observing the operation performance by computer simulation using a technology computer-aided design (TCAD) tool.

During the simulation, different bias voltages listed in Table 2 below may be applied to the first gate structure 112, the second gate structure 114, the third gate structure 116, the bit line BL (electrically connected to the region 120D, not shown in FIG. 1), to perform different operation modes, such as programming, erasing or reading operation modes. In the present embodiment and the accompanying drawings, "W1" is the abbreviation of "write 1", which indicates the operation mode of programming the memory cell unit of the memory structure 10 to the data state of "1" (i.e., logic "1"), and which is also called as the programming operation mode; "W0" is the abbreviation of "write 0", which indicates the operation mode of programming the memory cell unit of the memory structure 10 to the data state of "0" (i.e., logic "0"), and which is also called as the erasing operation mode; "Read" indicates the operation mode of reading the memory cells of the memory structure 10 to confirm the voltage data state of the individual memory cells.

TABLE 2

| | first gate structure 112 (V) | second gate structure 114 (V) | third gate structure 116 (V) | bit line BL (V) |
|---|---|---|---|---|
| W1 | 4 | 4 | 0 | 5 |
| W0 | 4 | 4 | 4 | −5 |
| Read | 4 | 4 | 2 | 0.5 |

Figure 4A:
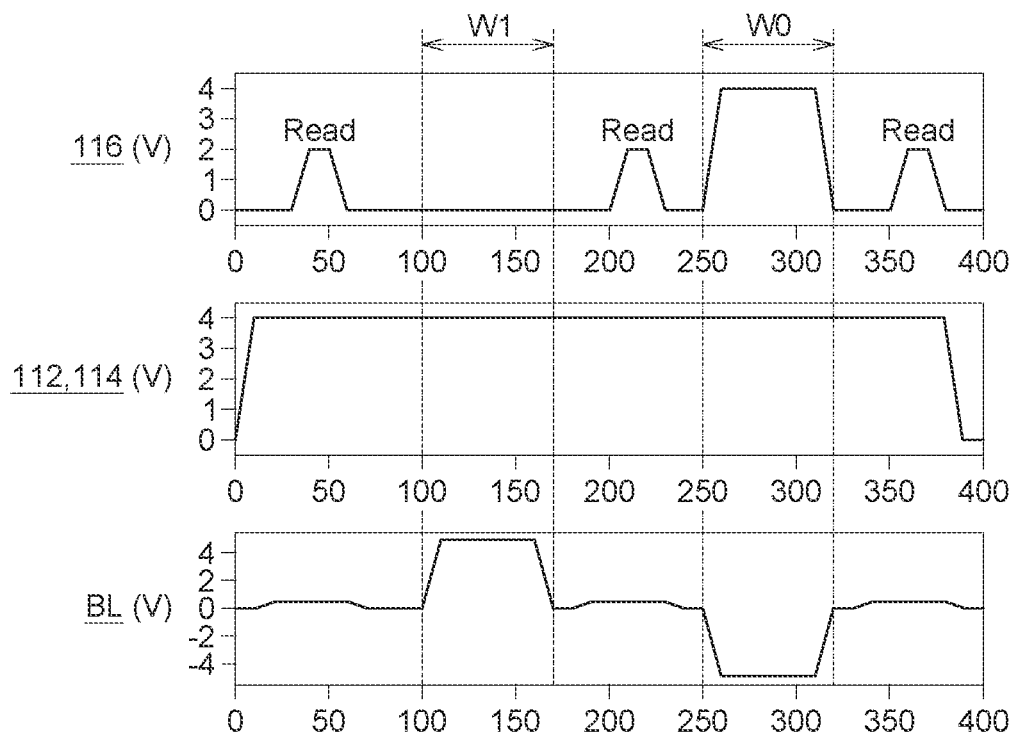
FIG. 4A shows a voltage-time relationship diagram of a memory structure in different operation modes according to an embodiment of the present invention.
Figure 4B:
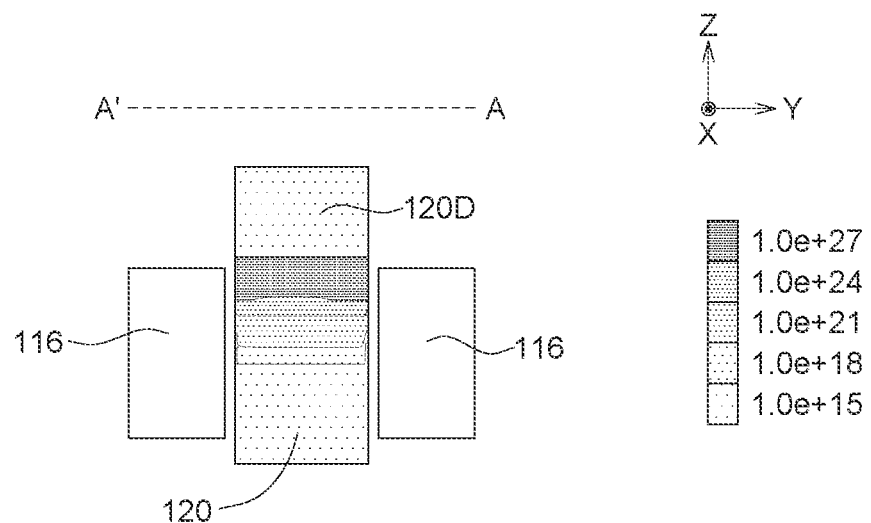
FIG. 4B illustrates the occurrence of band-to-band tunneling between the third gate structure and the bit line in the memory structure according to an embodiment of the present invention.
Figure 4C:
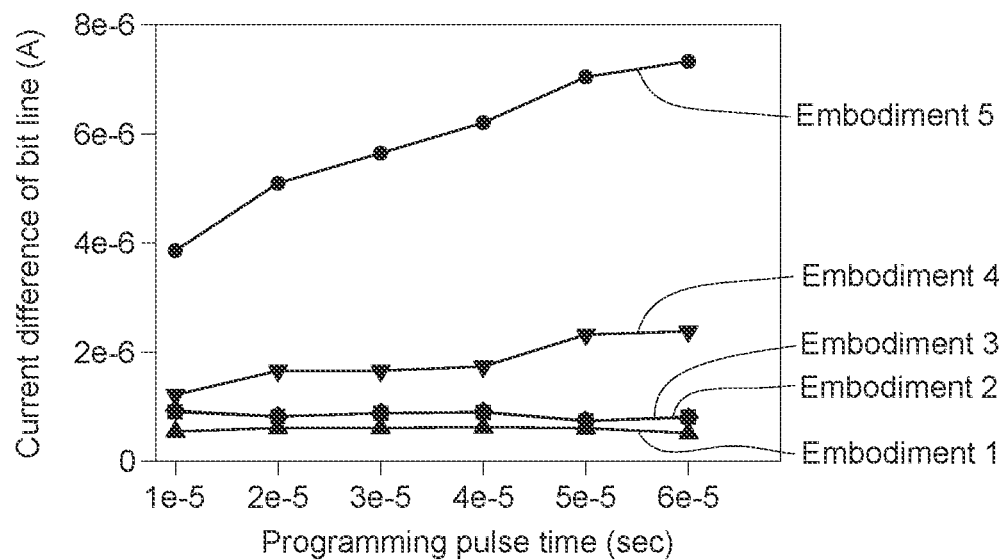
FIG. 4C shows a diagram illustrating the relationship between the programming pulse time and the current difference of the bit line between the programmed state and the erased state during the programming operation mode of the memory structure according to an embodiment of the present invention.
Figure 4D:
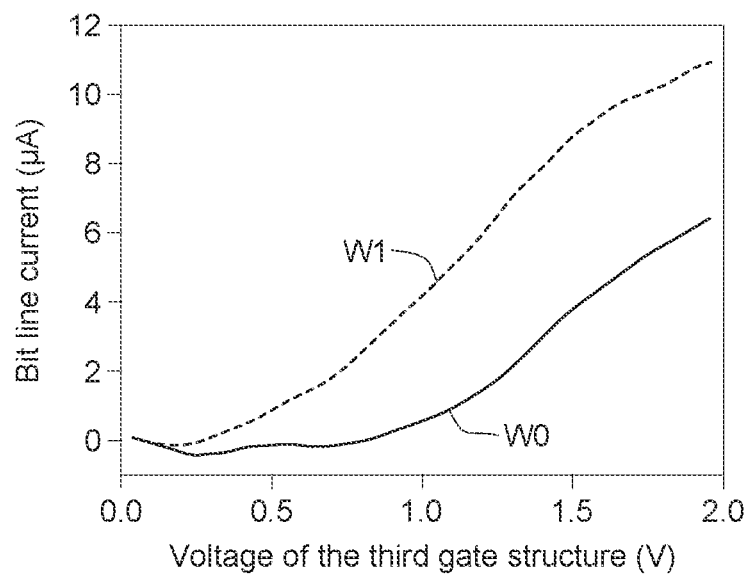
FIG. 4D shows a diagram illustrating the relationship between the voltage of the third gate structure and the bit line current of the memory structure in the programming operation mode and the erasing operation mode according to an embodiment of the present invention.

FIG. 4A illustrates a voltage (V)-time (μs) relationship diagram of the memory structure 10 in different operation modes according to an embodiment of the present invention. FIG. 4B illustrates the occurrence of band-to-band tunneling between the third gate structure 116 and the bit line BL in the programming operation mode of the memory structure 10 according to an embodiment of the present invention. FIG. 4C is a diagram illustrating the relationship between the programming pulse time (sec) and the current difference of the bit line BL between the programmed state and the erased state during the programming operation mode W1 of the memory structure 10 according to an embodiment of the present invention. FIG. 4D is a diagram illustrating the relationship between the voltage (V) and the bit line current (A) of the third gate structure 116 of the memory structure 10 in the programming operation mode W1 and the erasing operation mode W0 according to an embodiment of the present invention.

Referring to FIG. 4A, the X-axis represents time (μs), and the Y-axis represents voltage (V). FIG. 4A shows the relationship between voltage and time of programming operation mode W1, erasing operation mode W0 and reading operation mode Read in the first gate structure 112, the second gate structure 114, the third gate structure 116 and the bit line BL, respectively.

Referring to FIG. 4B, which shows a partial cross-sectional view along the line A-A' in FIG. 1, for illustrating the generation of band-to-band tunneling between the third gate structure 116 and the bit line BL in the programming operation mode W1. The higher the density of dots, the more the generation of band-to-band tunneling. That is, in the programming operation mode W1, electrons and holes are generated, and the holes flow into the channel body 120 to raise the potential of the channel body 120, so that the threshold voltage is lowered and the current is increased.

Referring to FIG. 4C, the X-axis represents the programming pulse time (sec), the Y-axis represents the current difference (A) of the bit line BL between the programmed state and the erased state, and Embodiments 1 to 5 respectively represent the embodiment in which 1V, 2V, 3V, 4V or 5V is applied to a bit line BL of the memory structure 10 in the programming operation mode W1, and the third gate structures 116 are all applied with 1V in the Embodiment 1 to 5. As the time of the programming operation mode W1 increases, more electrons and holes are generated, and more holes flow into the channel body 120, so the current in the channel body 120 can be higher, and the current difference between the erasing operation mode W0 and the programming operation mode W1 is also larger. Wherein, compared with Embodiments 1-4, the current difference between the programming operation mode W1 and the erasing operation mode W0 is larger in Embodiment 5, so 5V is more suitable as the operation voltage of the programming operation mode W1.

Referring to FIG. 4D, the X-axis represents the voltage (V) of the third gate structure 116, and the Y-axis represents the bit line current (A). When the results are read at the same voltage of the third gate structure 116, it can be found that the current of the programming operation mode W1 is greater than the current of the erasing operation mode W0. For example, when the voltage of the third gate structure 116 is 1.5 V, the current of the programming operation mode W1 is about 4 μA, and the current of the erasing operation mode W0 is about 9 μA.

Figure 5A:
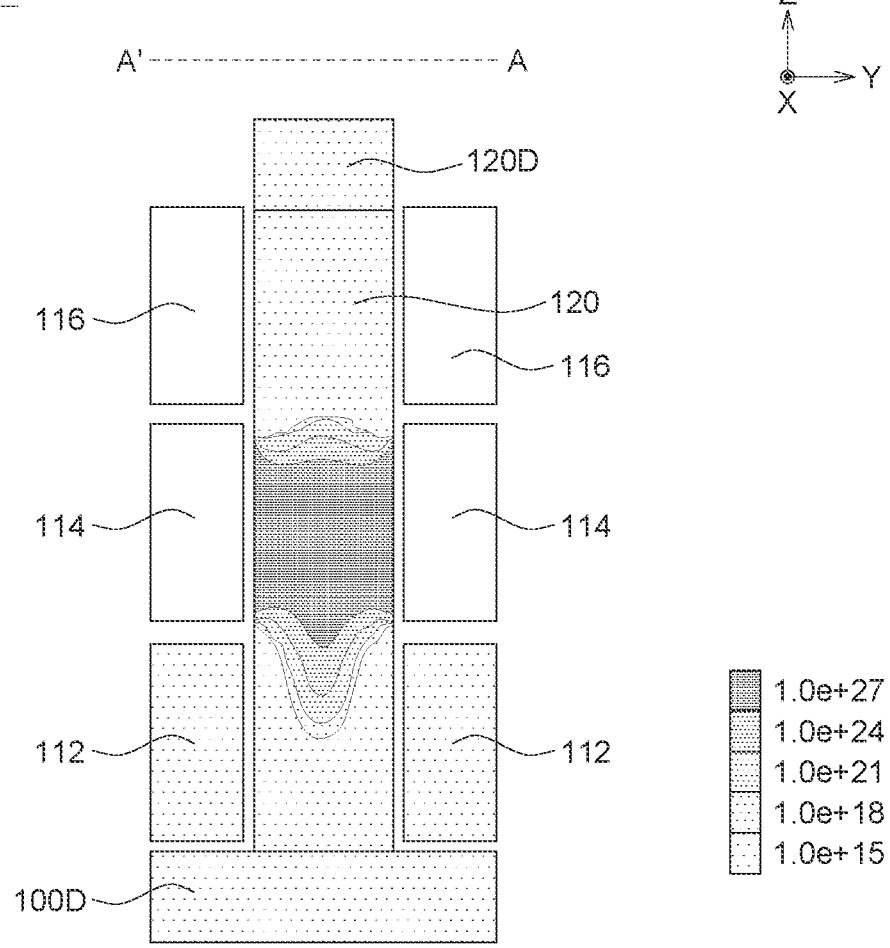
FIGS. 5A-6B show the simulation results of the band-to-band tunneling mechanism.
Figure 5B:
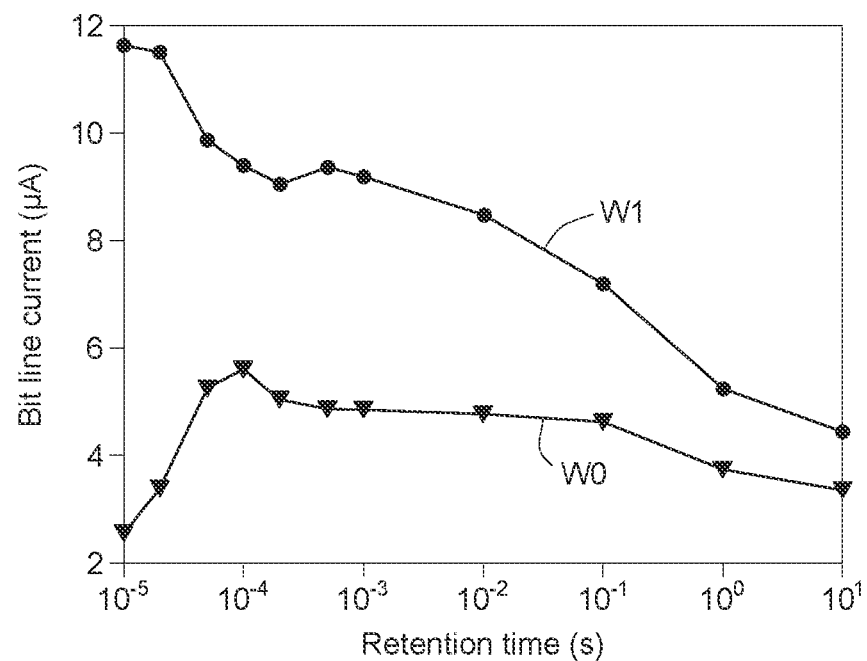
Figure 6A:
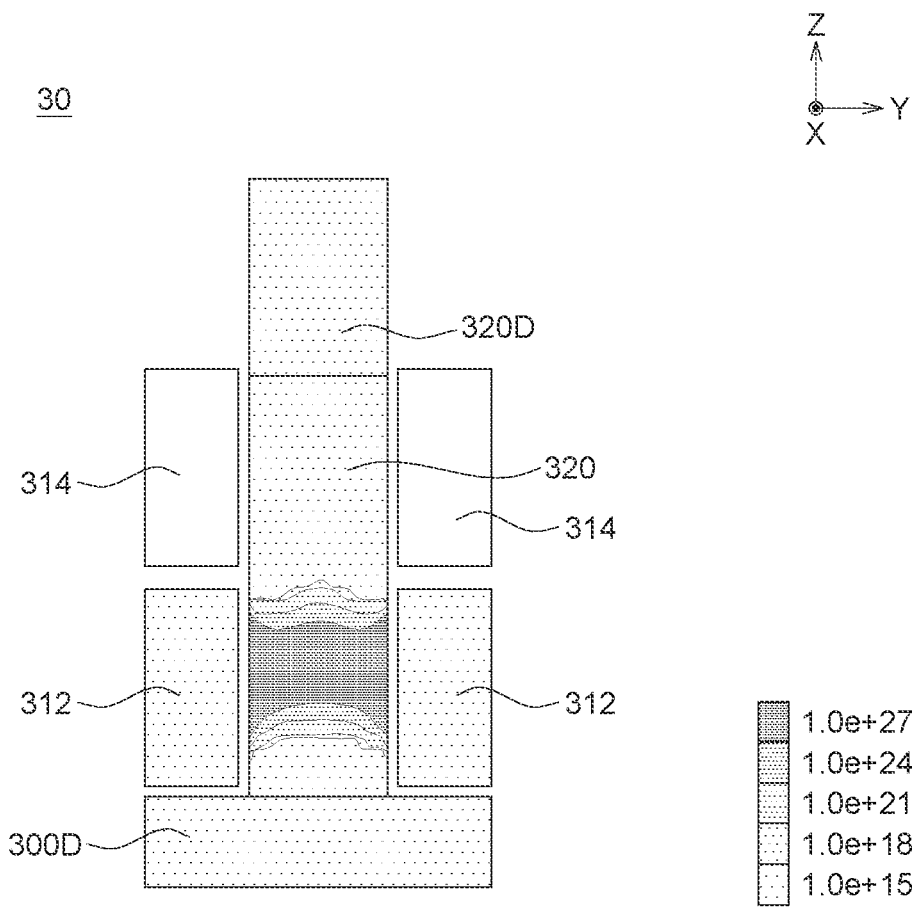
Figure 6B:
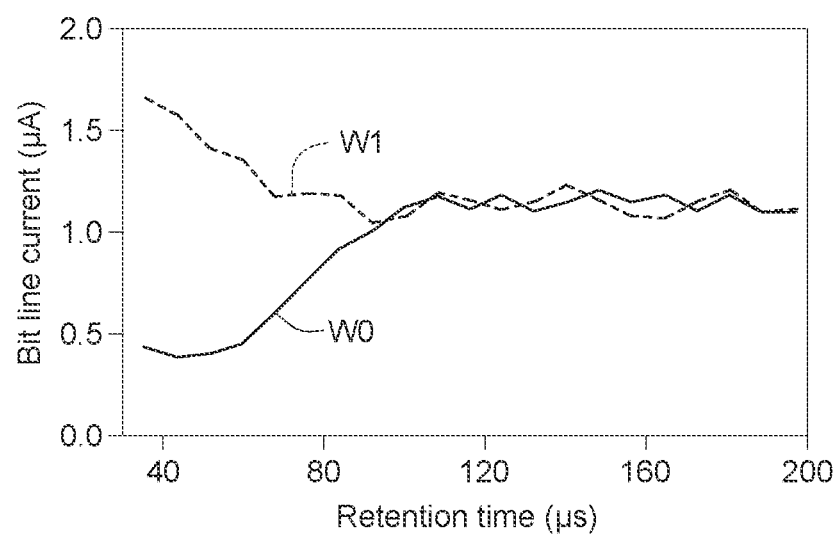

FIGS. 5A-6B illustrate the simulation results of the band-to-band tunneling mechanism, for example, using a technology computer-aided design (TCAD) tool to observe its operation performance through computer simulation. FIG. 5A shows the distribution of holes in the band-to-band tunneling mechanism of the memory structure 10 according to an Embodiment A of the present invention. FIG. 5B is a graph showing the relationship between the retention time (s) and the bit line current (μA) of the memory structure 10 in the band-to-band tunneling mechanism according to the embodiment A of the present invention. FIG. 6A shows the distribution of holes in the band-to-band tunneling mechanism of the memory structure 30 according to a Comparative example A. FIG. 6B is a graph showing the relationship between the retention time (μs) and the bit line current (μA) of the memory structure 30 according to a Comparative example A of the present invention. In FIGS. 5A and 6A, the higher the density of the dots, the more carriers (e.g., holes) are generated in the band-to-band tunneling mechanism.

Referring to FIG. 5A, which shows a cross-sectional view of the memory structure 10 taken along the line A-A'. In Embodiment A, both the region 100D of the substrate 100 adjacent to the upper surface 100a and the region 120D of the channel body 120 adjacent to the second end 120B (e.g., the top portion) have the first conductivity type, for example, may have high concentration of N-type doping (N+); the region 100D corresponds to the source line; the region 120D is electrically connected to the bit line. When the operation of band-to-band tunneling is performed, the holes are concentrated to the middle position of the channel body 120 (i.e., the position adjacent to the second gate structure 114).

Referring to FIG. 6A, which shows a cross-sectional view of the memory structure 30. The difference between the memory structure 30 and the memory structure 10 is that the memory structure 30 only has two gate structures (i.e., the first gate structure 312 and the second gate structure 314), and does not have a third gate structure. In Comparative Example A, both the region 300D of the substrate adjacent to the upper surface and the region 320D of the channel body 320 adjacent to the second end (e.g., the top portion) have the first conductivity type, such as high concentration of N-type doping (N+); the region 300D corresponds to the source line; the region 320D is electrically connected to the bit line. When the operation of band-to-band tunneling mechanism is performed, the holes are concentrated to the lower position of the channel body 320 (i.e., the position adjacent to the first gate structure 312).

As shown in FIG. 5B, in Embodiment A, when the retention time is $10^{-5}$ seconds, the current difference between the programming operation mode W1 and the erasing operation mode W0 of the memory structure 10 is about 10 μA, when the retention time is $10^{-1}$ seconds, the current difference between the programming operation mode W1 and the erasing operation mode W0 of the memory structure 10 can still reach about 2 μA. As shown in FIG. 6B, in Comparative Example A, at the beginning, the current difference between the programming operation mode W1 and the erasing operation mode W0 of the memory structure 30 is about 1.2 μA; however, when the time reaches 80 μs, there is almost no current difference between the programming operation mode W1 and the erasing operation mode W0 in the memory structure 30, so it is impossible to distinguish a logic "1" from a logic "0". Therefore, the memory structure 10 may have a better retention time than the memory structure 30.

Compared with the memory structure 30, in the operation mechanism of band-to-band tunneling, the location where the holes are concentrated in the memory structure 10 can be farther away from the substrate 100 (i.e., farther away from the source line), as shown in FIGS. 5A and 6A, so the leakage current can be reduced, the storage position of the carriers is less damaged, and the retention time can be increased, as shown in FIGS. 5B and 6B, so that the memory structure 10 has better retention characteristics.

Figure 7A:
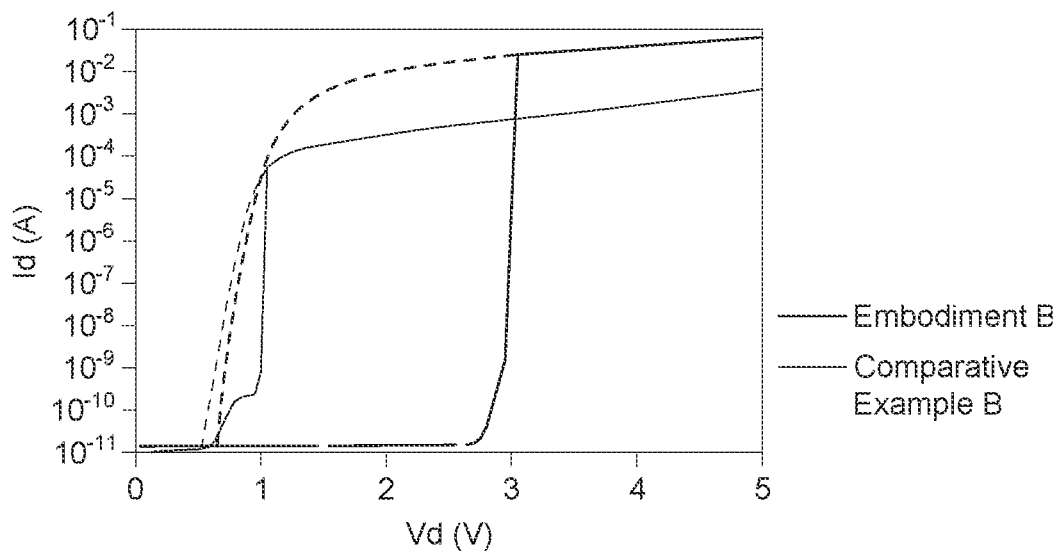
FIG. 7A shows simulation results of Embodiment B and Comparative Example B in the operating mechanism of the thyristor.
Figure 7B:
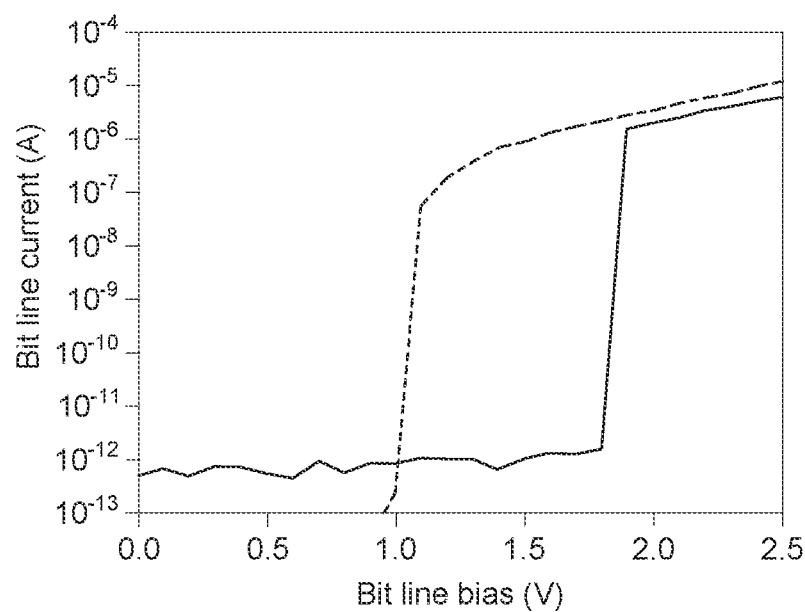
FIG. 7B shows experimental results of Embodiment B in the operating mechanism of the thyristor.

FIG. 7A shows the simulation results of Embodiment B and Comparative Example B in the operating mechanism of the thyristor, for example, using a technology computer-aided design (TCAD) tool to observe its operating performance through computer simulation. FIG. 7B shows the experimental result of Embodiment B in the operating mechanism of the thyristor.

Embodiment B has features partially similar to those of Embodiment A. For example, the memory structure 10 according to Embodiment B has the same or similar appearance as the memory structure 10 in FIG. 5A, and has three gate structures (i.e., the first gate structure 112, the second gate structure 114 and the third gate structure 116). The comparative example B has some features similar to those of the comparative example A. For example, the memory structure 30 according to the comparative example B has the same or similar appearance as the memory structure 30 in FIG. 6A, and has two gate structure (i.e. the gate structure 312 and the second gate structure 314). The difference between Embodiment B and Embodiment A is that in the memory structure 10 according to Embodiment B, the region 120D of the channel body 120 adjacent to the second end 120B has a second conductivity type, such as a high concentration of P-type doping (P+). The difference between the Comparative example B and the Comparative example A is that in the memory structure 30 according to the Comparative example B, the region 320D in the channel body 320 adjacent to the second end has the second conductivity type, for example, high concentration of P-type doping (P+).

Referring to FIG. 7A, the X-axis represents the drain voltage (Vd) (V), and the Y-axis represents the drain current (Id) (A). The solid curve represents forward bias (e.g., sweeping from left to right), and the dashed curve represents reverse bias (e.g., sweeping from right to left). The distance between the solid curve and the dashed curve under the same drain current represents the size of the thyristor window, that is, when the thyristor window is larger, the current difference between the programming operation mode W1 and the erasing operation mode W0 is greater, the easier it is to distinguish between logical "1" and logical "0". As shown in FIG. 7A, in the memory structure 10 according to Embodiment B, when the drain current is 1 μA, the thyristor window is about 2 V. In the memory structure 30 according to Comparative Example B, when the drain current is 1 μA, the thyristor window is about 0.3 V. It can be seen that, compared with the memory structure 30 according to the Comparative example B, the memory structure 10 according to the embodiment B can have a larger thyristor window, which is more beneficial to distinguish between logic "1" and logic "0".

Referring to FIG. 7B, the X-axis represents the bit line bias (V), and the Y-axis represents the bit line current (A). The curve formed by the solid lines represents forward bias (e.g., sweeping from left to right), and the curve formed by the dashed line represents reverse bias (e.g., sweeping from right to left). It can be seen from the experimental results that the memory structure 10 according to the embodiment B can indeed distinguish between logic "1" and logic "0". For example, when the bit line voltage is 1.5V, currents of different magnitudes can be distinguished, such as 6 orders of magnitude difference in current window, as shown in FIG. 7B.

In addition, since the region 120D of the memory structure 10 according to the embodiment B has a high concentration of P-type doping (P+), there are many holes in itself, compared with the memory structure 10 (that is, using the band-to-band tunneling mechanism) according to the embodiment A, the memory structure 10 according to the embodiment B (that is, using the thyristor mechanism) can move the holes into the channel body 120 at a lower operating voltage, and the generated electric field can be lower so that the retention time can be extended and the endurance characteristics can be better.

According to an embodiment of the present invention, a floating body cell DRAM (FBC DRAM) having three gates is provided, which can be applied to a NOR memory.

Compared with the memory structure with only 2 gate structures, the memory structure according to an embodiment of the present invention has 3 gate structures, and has higher flexibility in adjusting the length of the gates, and potential in the floating body can be relatively stable, thereby improving the memory window. In addition, carriers (such as holes) can be stored in the middle portion of the channel body (i.e., the position adjacent to the second gate structure in the channel body), which is farther away from the source and has better data retention. In addition, the 3-gate structure (i.e., 3 bit lines) can provide a more flexible operation method, so that the carrier generation can be improved, and there are more options when applying bias to maintain data retention.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A memory structure, comprising:
   a substrate;
   a first gate structure, a second gate structure and a third gate structure disposed on the substrate, separated from each other along a first direction and extending along a second direction and a third direction, respectively, wherein the second gate structure is disposed between the first gate structure and the third gate structure, the first direction, the second direction and the third direction are intersected with each other;
   a plurality of channel bodies separated from each other and passing through the first gate structure, the second gate structure and the third gate structure along the first direction, wherein each of the plurality of channel bodies has a first end and a second end, the first end is adjacent to the first gate structure, the second end is adjacent to the third gate structure, and the second end is opposite to the first end;
   a plurality of dielectric films disposed between the first gate structure and the channel bodies, between the second gate structure and the channel bodies, and between the third gate structure and the channel bodies;
   a first side plug electrically connected to the substrate; and
   a plurality of first side pads having a ring shape, stacked along the third direction, separated from each other along the third direction and extending along the second direction, wherein each of the plurality of first side pads is in electrical contact with the first side plug at an entire surface of a first surface of each of the first side pads facing the first side plug whereas each of the plurality of first side pads is electrically connected to corresponding one of the first ends of the plurality of channel bodies at a second surface opposite to the first surface, whereby the first side plug is electrically connected to the plurality of first side pads and the plurality of channel bodies;
   wherein the first gate structure, the second gate structure and the third gate structure surround each of the dielectric films and each of the channel bodies, and the dielectric films do not include a charge storage structure.

2. The memory structure according to claim 1, wherein a material of the channel bodies comprises monocrystalline silicon.

3. The memory structure according to claim 1, wherein the substrate has an upper surface, the upper surface is parallel to the first direction and the second direction, and a normal direction of the upper surface is parallel to the third direction.

4. The memory structure according to claim 3, wherein the third gate structure comprises a first island structure, a second island structure and a third island structure, the first island structure, the second island structure and the third island structure respectively extend along the third direction and are separated from each other along the second direction.

5. The memory structure according to claim 4, wherein a height of the first island structure, the second island structure or the third island structure in the third direction is equal to a height of the first gate structure or the second gate structure in the third direction, and a width of the first island structure, the second island structure or the third island structure in the second direction is smaller than a width of the first gate structure or the second gate structure in the second direction.

6. The memory structure according to claim 1, further comprising:
 a plurality of second side pads stacked along the third direction and separated from each other along the third direction, wherein each of the second side pads is connected to the second end of a corresponding one of the channel bodies.

7. The memory structure according to claim 6, further comprising a plurality of second side plugs, wherein the second side plugs are separated from each other along the second direction, and extend along the third direction to electrically contact a plurality of landing regions on the second side pads, respectively.

8. The memory structure according to claim 7, wherein heights of the second side plugs in the third direction increase along the second direction, and the landing regions form a stepped structure.

9. The memory structure according to claim 7, wherein the second side plugs are respectively connected to a bit line.

10. The memory structure according to claim 6, wherein the first side pads have a first conductivity type, and the second side pads have the first conductivity type.

11. The memory structure according to claim 6, wherein the first side pads have a first conductivity type, and the second side pads have a second conductivity type.

12. The memory structure according to claim 1, wherein a material of the dielectric films comprises a high dielectric constant material.

* * * * *